United States Patent [19]

Davies et al.

[11] Patent Number: 5,384,273

[45] Date of Patent: Jan. 24, 1995

[54] METHOD OF MAKING A SEMICONDUCTOR DEVICE HAVING A SHORT GATE LENGTH

[75] Inventors: Robert B. Davies, Tempe; Charles B. Anderson, Maricopa; Lawrence S. Klingbeil, Jr., Chandler; George B. Norris, Phoenix, all of Ariz.

[73] Assignee: Motorola Inc., Schaumburg, Ill.

[21] Appl. No.: 233,290

[22] Filed: Apr. 26, 1994

[51] Int. Cl.[6] .................. H01L 21/335; H01L 21/31
[52] U.S. Cl. ........................................ 437/41; 437/44; 437/228; 437/241; 437/912; 437/947; 437/981; 437/978; 156/653; 156/657
[58] Field of Search .................. 437/40, 41, 44, 228, 437/241, 912, 947, 981, 978; 156/628, 633, 653, 657

[56] References Cited

U.S. PATENT DOCUMENTS

| | | | |
|---|---|---|---|
| 4,732,871 | 3/1988 | Buchmann et al. | 437/41 |
| 4,839,303 | 6/1989 | Tully et al. | 437/31 |
| 4,994,872 | 2/1991 | Nishizawa et al. | |
| 5,110,751 | 5/1992 | Nakagawa | 437/40 |
| 5,281,839 | 1/1994 | Cambou et al. | |

FOREIGN PATENT DOCUMENTS

| | | |
|---|---|---|
| 58-123779 | 7/1983 | Japan . |
| 61-90467 | 8/1984 | Japan . |
| 59-225571 | 12/1984 | Japan . |
| 61-12079 | 1/1986 | Japan . |
| 61-89674 | 5/1986 | Japan . |
| 63-87773 | 4/1988 | Japan . |
| 2-205325 | 8/1990 | Japan . |

OTHER PUBLICATIONS

A. Hartstein et al., "A metal-oxide-semiconductor field-effect transistor with a 20-nm channel length." Journal of Applied Physics, 68 (5), 1 Sep. 1990, pp. 2493-2495.

Primary Examiner—T. N. Quach
Attorney, Agent, or Firm—Miriam Jackson

[57] ABSTRACT

A semiconductor device having a short gate length is fabricated. The short gate length is obtained by utilizing the fact that an unannealed silicon nitride can be isotropically etched while not etching an annealed silicon nitride layer. The method comprises forming a first silicon nitride 13 on a semiconductor material 10, annealing layer 13, forming an insulating layer 15, a second silicon nitride layer 17 and a masking layer 19, undercutting a portion of layers 17 and 15, removing the masking layer, annealing the second silicon nitride 17, implanting to form channel region 20 having portions 21 and 22, undercutting a portion of the insulating layer 15, removing the second silicon nitride 17 and the first silicon nitride 13 not covered by layer 15, forming gate 23 having effective gate length 30 and source/drain 25/26.

15 Claims, 1 Drawing Sheet

METHOD OF MAKING A SEMICONDUCTOR DEVICE HAVING A SHORT GATE LENGTH

BACKGROUND OF THE INVENTION

This invention relates, in general, to semiconductor devices, including, but not limited to, a gallium arsenide device having a short gate length and a method of fabricating it.

An important feature of gallium arsenide devices, such as MESFETs (Metal Semiconductor Field Effect Transistors) or HEMTs (High Electron Mobility Transistors), is its gate length. The length of the gate is directly proportional to the frequency response of these gallium arsenide devices. Devices having a shorter gate length enable higher frequency responses to be achieved. Devices fabricated by standard processing typically have a 20 GHz capability. It would be desirable to fabricate a MESFET having a 100 GHz capability. However, in the past there has been a limit as to how short gate lengths can be fabricated using standard processing techniques, due to the processing constraints of present standard photolithographic means. A way or achieving shorter gate lengths is by using electron beam technology rather than standard photolithographic means. However, electron beam processing is not very manufacturable and is very expensive to use at this time. It would also be desirable to fabricate devices having a short gate length without the use of electron beam technology using a self-aligned gate process. A self-aligned gate process provides for better reproducibility and reduces some parasitic capacitances in the device.

SUMMARY OF THE INVENTION

A method of fabricating a channel region of a semiconductor device, comprising the steps of providing a semiconductor material, having a top surface. A first silicon nitride layer is formed over the top surface of the semiconductor material and then annealed. An insulating layer is formed over the silicon nitride layer, and a second silicon nitride layer is formed over the insulating layer. A masking layer is formed over a portion of the second silicon nitride layer. A portion of the second silicon nitride layer and a portion of the insulating layer are isotropically etched. The masking layer is removed. The second silicon nitride layer is annealed after the step of removing the masking layer. A channel region is ion implanted into the semiconductor material so that the channel region has a first and a second portion wherein the first portion extends deeper into the semiconductor material from the top surface than the second portion. A portion of the insulating layer is isotropically etched and then the second silicon nitride layer and a portion of the first silicon nitride layer which does not have the insulating layer formed thereover are removed.

DETAILED DESCRIPTION OF THE DRAWINGS

Figure 1:
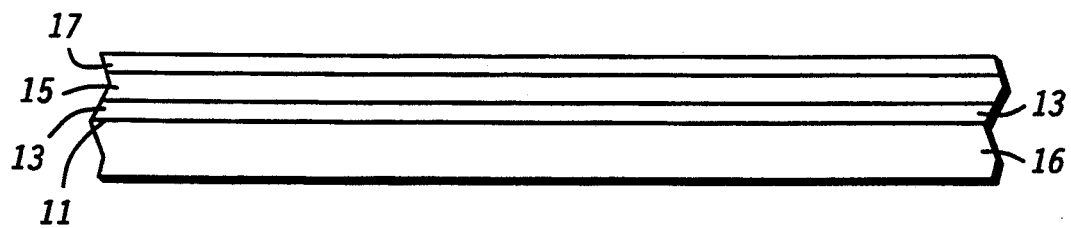
FIG. 1 illustrates an enlarged, cross-sectional view of an embodiment of the present invention in a beginning stage of fabrication.

FIG. 1 illustrates an enlarged, cross-sectional view of a first embodiment of the present invention in a beginning stage of fabrication. FIG. 1 illustrates a semiconductor material 10 having a top surface 11. In a preferred embodiment, semiconductor material 10 is comprised of a semi-insulating substrate, preferably an undoped gallium arsenide. First, a first silicon nitride layer 13 is formed on top surface 11 of semiconductor material 10. In a preferred embodiment, the thickness of first silicon nitride layer 13 is in the range of approximately 300–700 Angstroms, and is formed by a plasma enhanced chemical vapor deposition process.

Next, an insulating layer 15 is formed on first silicon nitride layer 13. In a preferred embodiment, insulating layer 15 is comprised of silicon dioxide and has a thickness of in the range of approximately 1000–2000 Angstroms. After the formation of insulating layer 15, the structure is subjected to an anneal in order to densify first silicon nitride layer 13 and insulating layer 15. In a preferred embodiment, the anneal is performed at a temperature of approximately 800° C. to 900° C. for approximately 30–50 seconds in a rapid thermal anneal process. Other anneals may be suitable.

Thereafter, a second silicon nitride layer 17 is formed on insulating layer 15. In a preferred embodiment, the thickness of second silicon nitride layer 17 is in the range of approximately 300–700 Angstroms, and is formed by a plasma enhanced chemical vapor deposition process.

Figure 2:
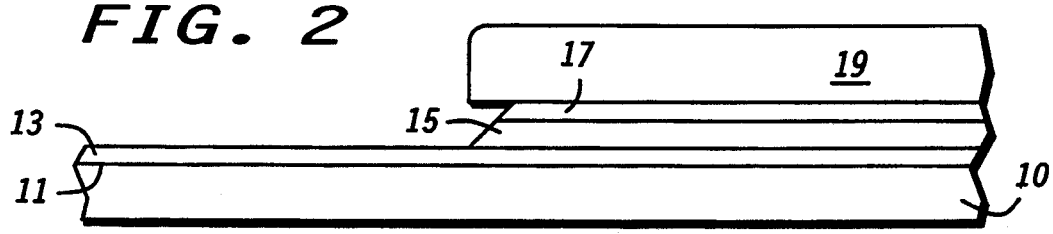
FIG. 2 illustrates an enlarged, cross-sectional view of the embodiment of the present invention in a further stage of fabrication.

FIG. 2 illustrates the structure of FIG. 1 further along in processing. A portion of insulating layer 15 and second silicon nitride layer 17 is then removed so that second silicon nitride layer 17 is isotropically undercut and insulating layer 15 is isotropically undercut. Preferably, this undercut of both layers is in the range of approximately 1500–2500 Angstroms.

This step can be accomplished by forming a patterned photoresist layer 19 on second silicon nitride layer 17 and then dry etching second silicon nitride layer 17. The dry etch, either reactive ion etching or plasma etching, selectively etches second silicon nitride layer 17. Then, insulating layer 15 and second silicon nitride layer 17 are isotropically etched. A wet hydrofluoric acid based etchant, for example, may be used. Unannealed, second silicon nitride layer 17 will be undercut when etched. Substantially no etching of second silicon nitride layer 17 would be obtained if it was annealed prior to this step, as is first silicon nitride layer 13. This invention could not have been carried out without recognizing the fact that annealed silicon nitride and unannealed silicon nitride have different etch properties. Optimally, the hydrofluoric acid based etchant is performed by alternately spraying and soaking the structure of FIG. 2 during the etch process.

More specifically, it was found that by defining the spray and soak times per equation 1 and 2 below, the process allows the vertical portion of the wet etch to dominate the later stages, thus preventing undercut of second silicon nitride layer 17 during the later stages of the etch.

$$T_{spray} = e^{(x-1)} \text{ where } x = \{0, 1, 2, 3, 4, \ldots A-1, A\} \quad \text{Equation 1}$$

$$T_{soak} = e^{(y-1)} \text{ where } y = \{A, A-1, \ldots, 4, 3, 2, 1, 0\} \quad \text{Equation 2}$$

Where $x + y = A$; $T_{spray}$ is the amount of time the structure is sprayed with a hydrofluoric acid based etchant; and $T_{soak}$ is the amount of time the structure is soaked with the hydrofluoric acid based etchant.

Figure 3:
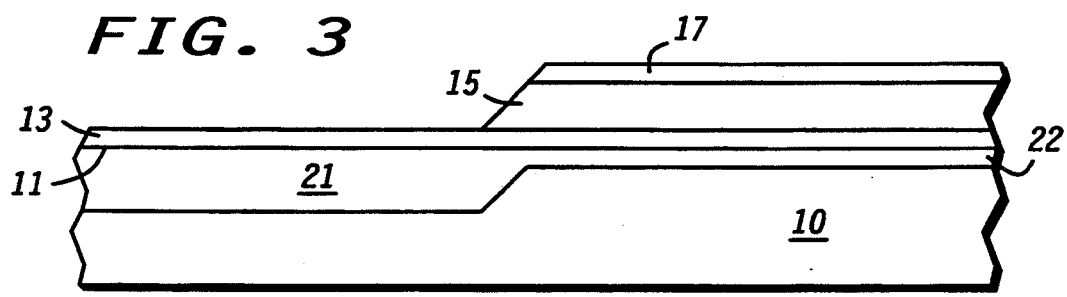
FIG. 3 illustrates an enlarged, cross-sectional view of the embodiment of the present invention in a further stage of fabrication.

This process also creates a preferred profile which when used as the implant mask in subsequent processing defines a preferred implant profile of a channel region 20 (shown in FIG. 3). In addition, this spray/soak process allows for the undercut of second silicon nitride layer 17 at substantially the same rate as insulating layer 15. Also, because insulating layer 15 is also densified (annealed) it provides for better repeatability by reducing the etch rate difference between unannealed second silicon nitride 17 and annealed insulating layer 15.

FIG. 3 illustrates the structure of FIG. 2 further along in processing. Photoresist layer 19 is removed. Then, an anneal is performed to densify second silicon nitride layer 17 so that remaining second silicon nitride layer 17 may act as a mask such that a second isotropic or undercut etch of insulating layer 15 can be etched to define the gate length of the device, without etching second silicon nitride layer 17 (The etch step is described with reference to FIG. 4.).

Then, a channel region 20 is formed by ion implantation in semiconductor material 10. In this embodiment, channel region 20 is formed by ion implanting an N-type dopant such as silicon. Preferably, the ion implant parameters are chosen so that a channel region 20 is formed having a first portion 21 which extends further into semiconductor material 10 from top surface 11 than a second portion 22 positioned below insulating layer 15 and silicon nitride layer 17. First portion 21 is continuous with second portion 22. Note that the profile of insulating layer 17 is replicated by channel region 20. In a preferred embodiment, the peak concentration of the ion implanted dopant is positioned at 3500 Angstroms.

Figure 4:
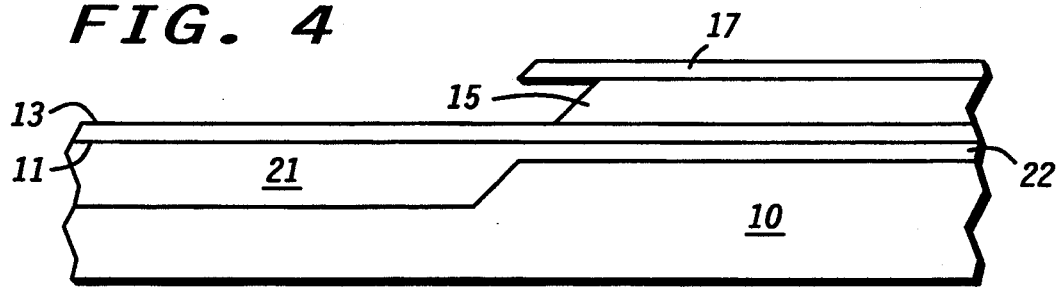
FIG. 4 illustrates an enlarged, cross-sectional view of the embodiment of the present invention in a further stage of fabrication.

FIG. 4 illustrates the structure of FIG. 3 further along in processing. Insulating layer 15 is etched so that it is further isotropically etched or undercut so that the edge of insulating layer 15 at top surface 11 is substantially close to the edge of the second portion 22 of channel region 20 where second portion 22 goes into first portion 21. A wet hydrofluoric acid based etchant is suitable.

Figure 5:
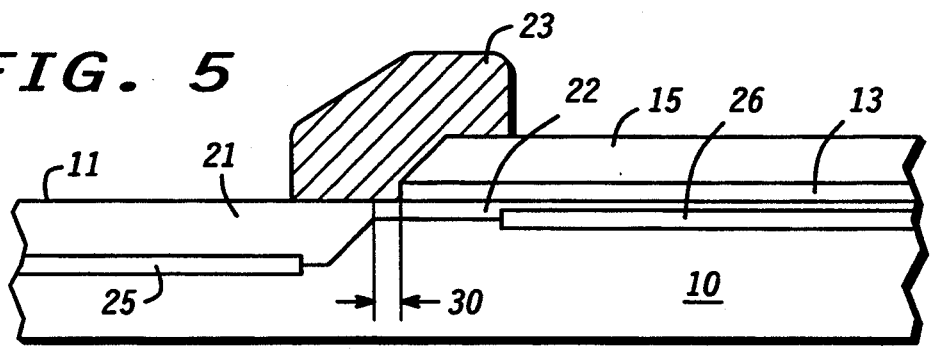
FIG. 5 illustrates an enlarged, cross-sectional view of the embodiment of the present invention in a further stage of fabrication.

FIG. 5 illustrates the structure of FIG. 4 further along in processing. First, the exposed portions of first and second silicon nitride layers 13 and 17 are removed. This etch is preferably performed by a dry etch. Insulating layer 15 is not etched during this process, and therefore acts as a mask for first silicon nitride layer 13. A slight oxide etch is performed to serve as a premetal deposition clean. At the same time, a portion of insulating layer 15 is etched if it is comprised of oxide or another type of insulating layer which is also etched by etchants that etch oxide.

Subsequently, a gate layer 23 is formed on a portion of top surface 11 and extending over a portion of insulating layer 15. Gate layer 23 is comprised of a refractory metal. Because second portion of the channel region 22 is not substantially depleted during operation, the effective gate length can be set by the overlap of gate layer 23 over first portion of the channel region 21.

A MESFET having an effective gate length 30 (shown in FIG. 5) of approximately less than 0.15 to 0.25 microns can be manufactured by using the method shown herein. Gate length 30 is defined by the amount that gate layer 23 makes physical contact with channel region 21. Source/drain regions 25 and 26 of the first conductivity type are then formed in semiconductor material 10 overlapping portions of first portion of channel region 21 and second portion of channel region 22. Source/drain regions 25 and 26 are preferably formed by ion implantation of a suitable N+ dopant. Electrical contact to source/drain regions 25 and 26 is made subsequently by processes well known in the art.

As can be readily seen, a method of fabricating a self-aligned MESFET has been provided. The gate length of the MESFET is established by taking advantage of etching techniques and etching properties of annealed and unannealed silicon nitride. This gate length is shorter than that which can be achieved by standard photolithographic means, thus a higher frequency response device can be fabricated using the present invention.

We claim:

1. A method of fabricating a channel region of a semiconductor device, comprising the steps of:
   providing a semiconductor material, having a top surface;
   forming a first silicon nitride layer over the top surface of the semiconductor material;
   annealing the first silicon nitride layer;
   forming an insulating layer over the silicon nitride layer;
   forming a second silicon nitride layer over the insulating layer;
   forming a masking layer over a portion of the second silicon nitride layer;
   isotropically etching a portion of the second silicon nitride layer and a portion of the insulating layer, using the masking layer as a mask;
   removing the masking layer;
   annealing the second silicon nitride layer after the step of removing the masking layer;
   ion implanting a channel region into the semiconductor material so that the channel region has a first and a second portion wherein the first portion extends deeper into the semiconductor material from the top surface than the second portion;
   isotropically etching a portion of the insulating layer; and
   removing the second silicon nitride layer and a portion of the first silicon nitride layer which does not have the insulating layer formed thereover.

2. The method of claim 1 wherein the step of isotropically etching a portion of the second silicon nitride layer and a portion of the insulating layer comprises etching with a hydrofluoric acid based etchant.

3. The method of claim 1 wherein the step of isotropically etching a portion of the second silicon nitride layer and a portion of the insulating layer comprises etching with a hydrofluoric acid based etchant performed by alternately spraying and soaking the semiconductor material.

4. The method of claim 1 wherein the step of isotropically etching a portion of the second silicon nitride layer and a portion of the insulating layer comprises etching with a hydrofluoric acid based etchant performed by alternately spraying and soaking the semiconductor material according to the following equations:

$$T_{spray} = e^{(x-1)} \text{ where } x = \{0, 1, 2, 3, 4, \ldots A-1, A\}$$

and $$T_{soak} = e^{(y-1)} \text{ where } y = \{A, A-1, \ldots, 4, 3, 2, 1, 0\}$$

where $x + y = A$ and $T_{spray}$ is the amount of time the semiconductor material is sprayed with the hydrofluoric acid based etchant and $T_{soak}$ is the amount of time the semiconductor material is soaked with the hydrofluoric acid based etchant.

5. The method of claim 1 further comprising the step of selectively etching a portion of the second silicon nitride layer before the step of isotropically etching a portion of the second silicon nitride layer and a portion of the insulating layer.

6. A method of fabricating a channel region of a semiconductor device, comprising the steps of:
   providing a semiconductor material, having a top surface;
   forming a first silicon nitride layer over the top surface of the semiconductor material;
   annealing the first silicon nitride layer;
   forming an insulating layer over the silicon nitride layer;
   forming a second silicon nitride layer over the insulating layer;
   forming a masking layer over a portion of the second silicon nitride layer;
   undercutting a portion of the second silicon nitride layer and a portion of the insulating layer;
   removing the masking layer;
   annealing the second silicon nitride layer after the step of removing the masking layer;
   ion implanting a channel region into the semiconductor material so that the channel region has a first and a second portion wherein the first portion extends deeper into the semiconductor material from the top surface than the second portion;
   undercutting a portion of the insulating layer;
   removing the second silicon nitride layer and a portion of the first silicon nitride layer which does not have the insulating layer formed thereover; and
   forming a gate layer on the top surface of the semiconductor material over a portion of the first and the second portions of the channel region; and
   forming a source region and a drain region in a portion of the semiconductor material, using the gate layer as a mask.

7. The method of claim 6 wherein the step of undercutting a portion of the second silicon nitride layer and a portion of the insulating layer comprises etching with a hydrofluoric acid based etchant.

8. The method of claim 6 wherein the step of undercutting a portion of the second silicon nitride layer and a portion of the insulating layer comprises etching with a hydrofluoric acid based etchant performed by alternately spraying and soaking the semiconductor material.

9. The method of claim 6 wherein the step of undercutting a portion of the second silicon nitride layer and a portion of the insulating layer comprises etching with a hydrofluoric acid based etchant performed by alternately spraying and soaking the semiconductor material according to the following equations:

$$T_{spray} = e^{(x-1)} \text{ where } x = \{0, 1, 2, 3, 4, \ldots A-1, A\}$$

and $$T_{soak} = e^{(y-1)} \text{ where } y = \{A, A-1, \ldots, 4, 3, 2, 1, 0\}$$

where $x + y = A$ and $T_{spray}$ is the amount of time the semiconductor material is sprayed with the hydrofluoric acid based etchant and $T_{soak}$ is the amount of time the semiconductor material is soaked with the hydrofluoric acid based etchant.

10. The method of claim 6 further comprising the step of selectively etching a portion of the second silicon nitride layer before the step of undercutting a portion of the second silicon nitride layer and a portion of the insulating layer.

11. A method of fabricating a channel region of a semiconductor device, comprising the steps of:
    providing a semiconductor material, having a top surface;
    forming a first silicon nitride layer over the top surface of the semiconductor material;
    forming an insulating layer over the silicon nitride layer;
    performing an anneal step to anneal the first silicon nitride layer and the insulating layer;
    forming a second silicon nitride layer over the insulating layer;
    forming a masking layer over a portion of the second silicon nitride layer;
    isotropically etching a portion of the second silicon nitride layer and a portion of the insulating layer using the masking layer as a mask, while not etching the first silicon nitride layer, wherein the first silicon nitride layer is not etched because the first silicon nitride layer has been annealed;
    removing the masking layer;
    performing an anneal step to anneal the second silicon nitride layer after the step of removing the masking layer;
    ion implanting a channel region into the semiconductor material so that the channel region has a first and a second portion wherein the first portion extends deeper into the semiconductor material from the top surface than the second portion;
    isotropically etching a portion of the insulating layer, while not etching the first silicon nitride layer and the second silicon nitride layer, wherein the first silicon nitride layer and the second silicon nitride layer are not etched because the first silicon nitride layer and the second silicon nitride layer has been annealed; and
    removing the second silicon nitride layer and a portion of the first silicon nitride layer which does not have the insulating layer formed thereover.

12. The method of claim 11 wherein the step of isotropically etching a portion of the second silicon nitride layer and a portion of the insulating layer comprises etching with a hydrofluoric acid based etchant.

13. The method of claim 11 wherein the step of isotropically etching a portion of the second silicon nitride layer and a portion of the insulating layer comprises etching with a hydrofluoric acid based etchant performed by alternately spraying and soaking the semiconductor material.

14. The method of claim 11 wherein the step of isotropically etching a portion of the second silicon nitride layer and a portion of the insulating layer comprises etching with a hydrofluoric acid based etchant performed by alternately spraying and soaking the semiconductor material according to the following equations:

$$T_{spray} = e^{(x-1)} \text{ where } x = \{0, 1, 2, 3, 4, \ldots A-1, A\}$$

and $$T_{soak} = e^{(y-1)} \text{ where } y = \{A, A-1, \ldots, 4, 3, 2, 1, 0\}$$

where $x + y = A$ and $T_{spray}$ is the amount of time the semiconductor material is sprayed with the hydrofluoric acid based etchant and $T_{soak}$ is the amount of time the semiconductor material is soaked with the hydrofluoric acid based etchant.

15. The method of claim 11 further comprising the step of selectively etching a portion of the second silicon nitride layer before the step of isotropically etching a portion of the second silicon nitride layer and a portion of the insulating layer.

* * * * *